Jan. 31, 1967 T. F. OLSON 3,302,157

TRANSISTOR SOCKET ASSEMBLY FOR PRINTED CIRCUIT BOARD

Filed March 24, 1964 2 Sheets-Sheet 1

INVENTOR.
Thor F. Olson
BY Nicholas A. Camasto
ATTY.

Jan. 31, 1967 T. F. OLSON 3,302,157

TRANSISTOR SOCKET ASSEMBLY FOR PRINTED CIRCUIT BOARD

Filed March 24, 1964 2 Sheets-Sheet 2

INVENTOR.
Thor F. Olson
BY Nicholas A. Buresto
ATTY.

United States Patent Office 3,302,157
Patented Jan. 31, 1967

3,302,157

TRANSISTOR SOCKET ASSEMBLY FOR PRINTED CIRCUIT BOARD

Thor F. Olson, Villa Park, Ill., assignor to Admiral Corporation, Chicago, Ill., a corporation of Delaware
Filed Mar. 24, 1964, Ser. No. 354,225
6 Claims. (Cl. 339—17)

This invention relates to transistor socket assemblies. More specifically, it relates to an improved transistor socket assembly, hereinafter referred to as a socket suitable for coaction with a printed circuit board and capable of receiving power transistors. The invention can be used in a number of environments and can be adapted to receive a variety of power transistors, but will be described in an environment in which the printed circuit board is permanently affixed to a rigid chassis and in which the socket is holding a power transistor of the TO3 type. This choice is merely for the convenience of description, and it should be appreciated that the invention is not intended to be limited to such usage.

Since the relatively recent introduction of transistors to electronic circuitry, various sockets for receiving and retaining the transistor plug-in terminals have been devised. These sockets have primarily been molded structures similar in many respects to convention vacuum tube sockets. Transistor sockets previously have been relatively expensive to manufacture and have usually required riveting or other elaborate methods to insure their permanent mechanical connection to the printed circuit board or to the chassis. In addition, after mechanical connection of a socket to a printed circuit board or chassis, electrical connection between the socket terminals and other elements of the circuit was necessary. Thus, after mechanically connecting a socket to a board or chassis, leads had to be run from the socket terminals to other circuit elements before the socket could become an integral part of the circuit.

Receiving socket portions, that is the female socket members found in prior art sockets have exhibited difficulty in adapting to slight irregularities in the shape and alignment of the transistor plug-in terminals, or male socket members, and electrical contact therebetween has often been found to be intermittent, due to poor mechanical contact.

As an alternative, transistors have been incorporated into circuits by soldering their terminals directly to individual elements of the circuit. This soldering increased production time, and the heat generated during the operation could have a deleterious effect on the transistor. It is obvious that this method made replacement of the transistor difficult and time-consuming and subjected the new transistor to the same heat problem during its installation as confronted the old one.

The present invention contemplates a transistor assembly suitable for use with conventional printed circuitry such that the aforementioned problems now present in the art will be eliminated. The socket of the invention is especially suitable, as has been stated, with transistors of the TO3 type. In this transistor, two plug-in terminals of short sturdy wire comprise the base and emitter electrodes, and a metal encapsulating jacket comprises the third terminal, which is the collector electrode. By following the teachings of the invention a more economical socket can be manufactured, and its inclusion within an electrical circuit will be facilitated. The socket of the invention therefore effects a double economy for the prospective user; the first being the economy of its manufacture, the second being the reduction in the cost of its installation.

Accordingly, it is an object of this invention to provide an improved transistor socket assembly.

Another object of the invention is to provide a transistor socket suitable for use with printed circuits.

A further object of the invention is to provide a socket for use with printed circuits which is economical in its manufacture.

A still further object of the invention is to provide a socket capable of being mounted on a printed circuit board with a minimum of time and expense.

Still another object of the invention is to provide a socket with improved facilities for receiving plug-in terminals of a transistor.

An even further object of the invention is to provide a socket whose parts are individually manufactured of low cost materials and which is assembled at the time that the socket is to be mounted on a printed circuit board.

Other objects of this invention will become apparent to those skilled in the art upon reading the specification in conjunction with the drawings; in which FIGURE 1 is a partial top perspective view of a chassis and a transistor, the transistor being received by a socket constructed in accordance with the invention;

Figure 1:
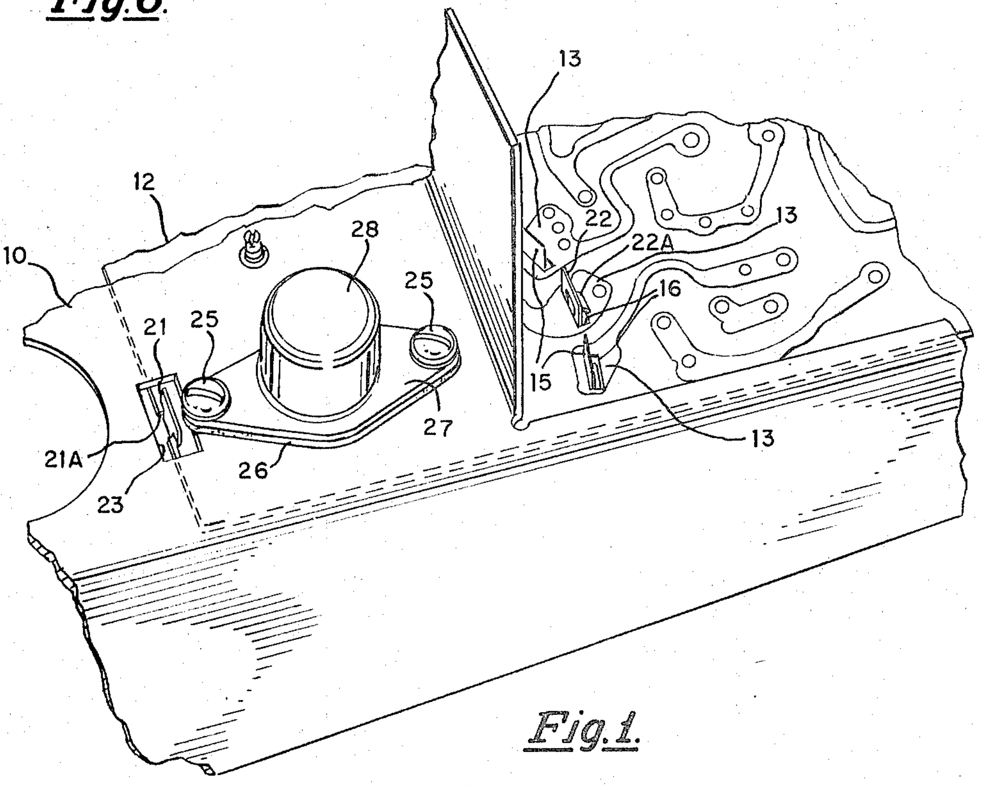
Figures 2, 3, 4:
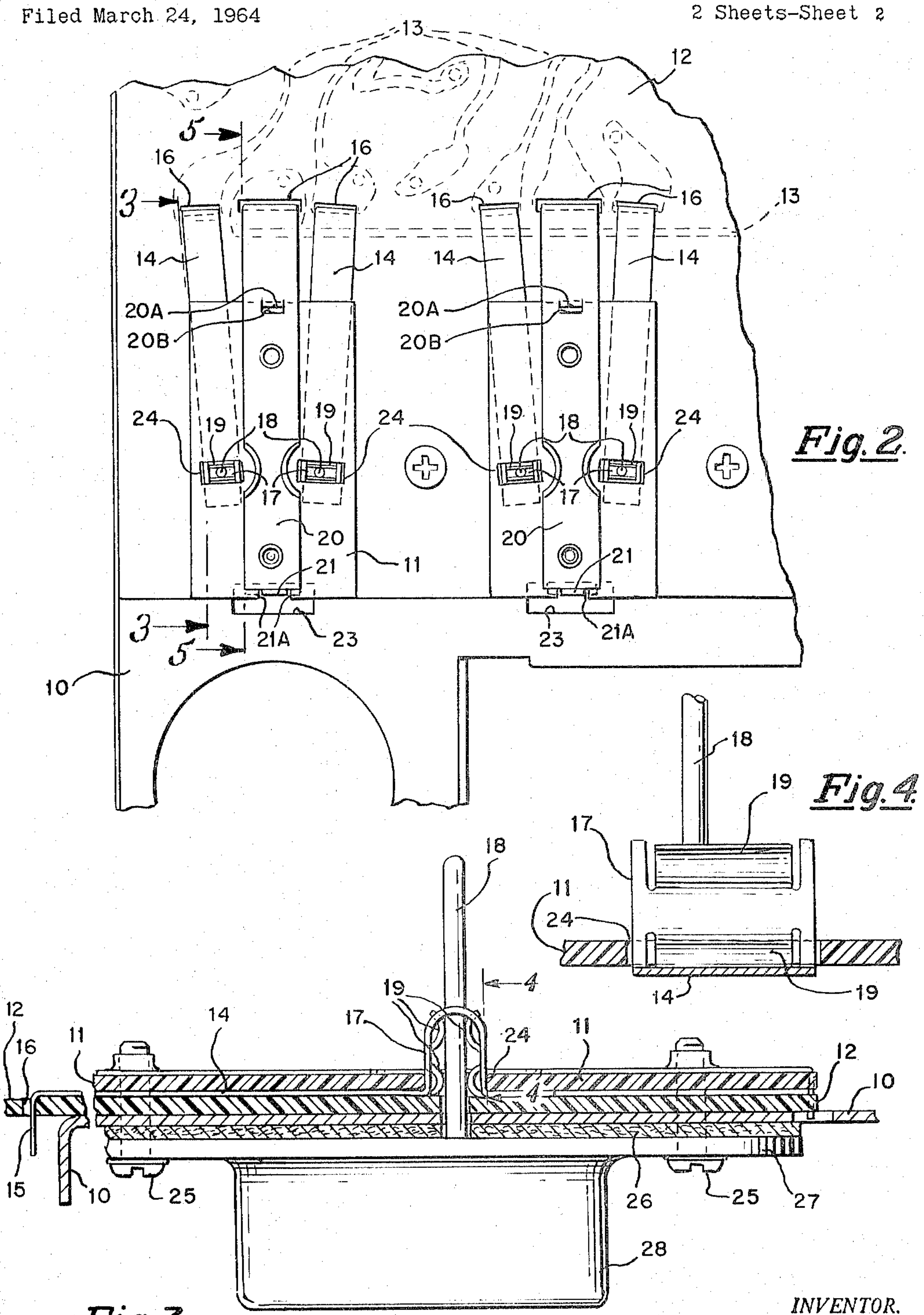
FIGURE 2 is a bottom view of a chassis upon which is mounted a socket constructed in accordance with the invention.
FIGURE 3 is an enlarged sectional view taken along section line 3—3 of FIG. 2 omitting all structure except the pin-receiving mechanism.
FIGURE 4 is an enlarged sectional view taken along section line 4—4 of FIG. 3.

Referring now to FIGURES 1 and 2, a printed circuit board 12 of non-conductive material, with conductive foils 13 affixed thereto in a conventional manner, is attached to a chassis 10. A dielectric socket base 11 is adjacent to the bottom of chassis 10 with conductive strips 14, constructed of a resilient metal interposed therebetween. Conductive strips 14 are formed such that one end 15 of each can be brought through individual orifices 16 in printed circuit board 12 such that each one of the ends 15 lies adjacent to an individual one of the conductive foils 13. The other end of strips 14 is formed into a socket portion 17, each socket portions accepting a plug-in terminal 18 of a transistor 28.

Reference is now made to FIGURES 3 and 4 which show the structure of sockets portion 17. Resilient contact flanges 19 are stamped from the wall and protrude towards the inside thereof, such that when plug-in terminal 18 is inserted thereinto each flange 19 offers an edge to plug-in terminal 18, and the resiliency of the metal enables flanges 19 to hold said edges in frictional contact with plug-in terminal 18. Flanges 19 are therefore in frictional contact with plug-in terminal 18 at four distinct points, each flange 19 yielding independently of the other three. In this way socket portion 17 is able to accept plug-in terminals which exhibit irregularities in their shape and alignment. This configuration effects a far superior electrical and mechanical hold upon the plug-in terminals than that afforded by sockets currently found in the art.

Figures 5, 6:
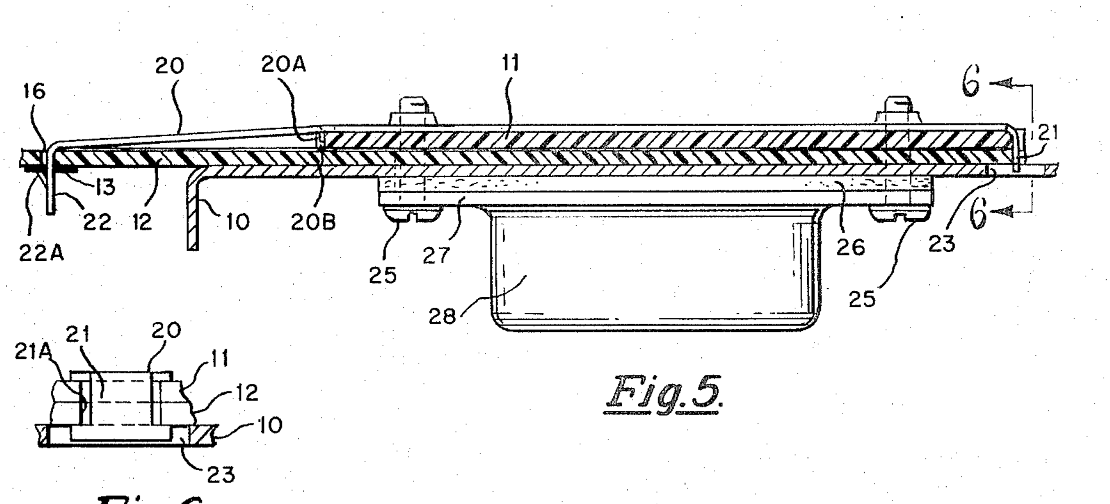
FIGURE 5 is an enlarged sectional view taken along section line 5—5 of FIG. 2 omitting all structure except the clipping mechanism.
FIGURE 6 is an enlarged sectional view taken along section line 6—6 of FIG. 5 omitting all structure but the hooking mechanism of the clip.

Referring now to FIGURES 5 and 6, a conducitve metal clip 20, constructed of a resilient material, is positioned adjacent to base 11 to insure immobility of the base in the following manner. One end of conductive metal clip 20 is formed into a first hook 21, the other end into a second hook 22. Immobility of base 11 is assured by interposing base 11 between conducting metal clip 20 and chassis 10 such that the resiliency of clip 20 exerts a force holding base 11 immobile against chassis 10. First hooked end 21 is inserted into a receiving aperture 23 of chassis 10 and is brought into engagement with notch 21A of printed circuit board 12. Second hooked end 22 is then snapped into a particular one of the orifices 16 of printed circuit board 12, adjacent to an individual one of the conductive foils 13. Tab 22A, stamped out of hooked end 22, protrudes out such that by hooked end 22 being snapped into place, tab 22A locks it against accidental withdrawal. The spacing between receiving aperture 23 and the aforementioned particular one of the orifices 16 is such that hooked end 22 must be distended slightly in order that it may be snapped into place. This spacing, combined with the resiliency of conductive metal clip 20, and with the locking action of tab 22A, insures against movement of clip 20 and thereby insures immobility of base 11.

In affixing the socket of the invention to a printed circuit board, preparatory to its use in an electrical device, metal strips 14 are placed adjacent to the under side of chassis 10 with bent ends 15 brought through individual orifices 16. Base 11 is then placed over conductive strips 14 such that apertures 24 within base 11 each receive a socket portion 17. Apertures 24 have the same shape and size as socket portions 17, therefore, when socket portions 17 are received by apertures 20, the close fit insures proper alignment of the strips 14, as well as their immobility during the remainder of the assembling process.

Conductive metal clip 20 is then placed over base 11 such that first hooked end 21 is received in receiving aperture 23 and engaged with notch 21A, and second hooked end 22 is snapped into its particular one of orifices 16 such that tab 22A locks it in place. Aligning tab 20A, stamped from clip 20 is received in receiving notch 20B, cut into base 11. Thus, immobility and alignment of base 11 is insured.

Electrical contact between bent ends 15 of metal strips 14 and their individual conductive foils 13, and of second hooked end 22 of conductive metal clip 20 and its individual conductive foil 13 is then established by hand soldering, automatic soldering, or any other suitable process. Plug-in terminals 18 of transistor 28 are inserted into their respective socket portions 17 such that apertures within the flanges 27 of the transistor are aligned with similar apertures in the chassis, the printed circuit board, the base, and the conductive metal clip 20. The transistor is then secured in place with a conductive securing device 25. An insulating washer 26 is interposed between transistor 28 and chassis 10 so that transistor 28 is electrically insulated from chassis 10 but can still dissipate its heat through the chassis.

What has been described is a novel transistor socket, especially suitable for use with printed circuit boards, being far more economical in its manufacture and installation, and which provides a more ideal contact with the transistor plug-in terminals than transistor sockets currently in use. The invention has been described in the environment of a printed circuit board permanently affixed to a rigid chassis and receiving a power transistor of the TO3 type. It will be readily appreciated that those skilled in the art can adapt it for use with different transistors and in different structures, including "plug-in boards" and the like. The invention is understood to be limited only as defined in the claims.

The embodiments of the invention in which an exclusive property or privilige is claimed are defined as follows:

1. In combination; an electrical circuit board having a plurality of conductive foil elements affixed thereto; a transistor to be mounted on said board and having a body and two plug-in terminals for electrical connection with respective ones of said foil elements; a socket assembly cooperating with said board for holding said transistor, said socket assembly comprising; first and second conductive straps, each of said conductive straps having a bent portion at one end, each bent portion extending through said printed circuit board adjacent to an individual one of said conductive foils, and a plug-in pin-receiving socket portion having resilient walls at the other end, said resilient walls defining a plurality of distinct contact surfaces each yielding independently of the others; an insulating plate forming orifices for receiving said plug-in pin-receiving socket portion and adapted to hold said first and second conductive straps against said printed circuit board; and a third conductive strap overlying and holding said conductive straps, said third conductive strap having hooked ends engaging said printed circuit board maintaining said first and said second conductive straps and said insulating plate in intimate contact with said printed circuit board, one of said hooked ends engaging said printed circuit adjacent to another individual one of said conductive foils; said third conductive strap comprising a pair of threaded receiving apertures, said transistor body forming a pair of mounting apertures in registration with said threaded receiving apertures, whereby said transistor may be mechanically and electrically connected to said third strap by means of conductive threaded fasteners.

2. In combination: a chassis; a printed circuit board, having a plurality of conductive foil elements affixed thereto, secured to one side of said chassis; a transistor, to be mounted on said chassis in heat exchange relationship therewith, having a body serving as one electrical terminal thereof and two plug-in terminals for electrical connection with respective ones of said foil elements; a socket assembly cooperating with said board for holding said transistor, said socket assembly comprising; first and second conductive straps, each strap having a lug portion adapted for connection to a different one of said foil elements and a socket portion adapted for resiliently receiving and holding a plug-in terminal of said transistor; an insulating plate forming apertures for receiving said socket portions and adapted to hold said straps against said board, a third conductive strap overlying and holding said insulating plate against said first and second conductive straps, said third conductive strap having end means thereon maintaining said aforementioned straps and plate in intimate contact with said board, and providing a connection to another one of said foil elements, and additional means forming a conductive path between the body of said transistor and said third strap.

3. The combination as set forth in claim 2 wherein each said socket portion includes substantially upright resilient walls forming a plug-in terminal receiving aperture, said socket portion extending through the corresponding aperture in said insulating plate and away from said printed circuit board; said resilient walls displaying a plurality of distinct contact-making surfaces and being distended when engaged by a plug-in terminal of said transistor, whereby said transistor is frictionally held in position.

4. The combination as set forth in claim 2 wherein said chassis defines a pair of openings substantially larger than said plug-in terminals; said transistor being positioned adjacent to said chassis with said plug-in terminals extending through said openings and into said socket portions; and a heat-conducting electrically insulating washer interposed between said transistor body and said chassis.

5. The combination as set forth in claim 4 wherein said third conductive strap defines a pair of spaced-apart threaded openings; said transistor body forming mounting apertures in registration with said threaded openings; and wherein said additional means comprise electrically conductive threaded fasteners securing said transistor to said chassis.

6. The combination as set forth in claim 5 wherein each of said lug portions is substantially flat and formed by bending one end of its corresponding strap substantially 90° thereto for extension through said board and electrical connection to correpsonding ones of said foil elements, and wherein said board includes a notched orifice aligned with said threaded openings; said third conductive strap being fabricated of resilient metal, one of the end means on said third conductive strap having an offset tab in electrical contact with a foil element, and including a hook formed from a right-angle bend, said hook having a flat terminus adapted for engagement in said notch; the resiliency of said metal strap causing pressure to be applied to said plate, thereby maintaining said plate, said first and second straps and said board in intimate "sandwich-like" contact.

References Cited by the Examiner

UNITED STATES PATENTS

| | | | |
|---|---|---|---|
| 2,312,181 | 2/1943 | Matthews | 339—17 X |
| 2,631,184 | 3/1953 | Sampson | 339—17 X |
| 2,730,690 | 1/1956 | Harasek | 339—17 X |
| 2,765,450 | 10/1956 | Richardson | 339—176 |
| 3,013,188 | 12/1961 | Kohler | 339—17 X |
| 3,043,022 | 7/1962 | Crews et al. | 339—17 X |
| 3,078,596 | 2/1963 | Sweeton | 35—19 |
| 3,096,466 | 12/1963 | Gossard | 339—17 X |
| 3,114,586 | 12/1963 | Albert | 339—17 |

OTHER REFERENCES

Buckminister, IBM Technical Disclosure, February 1959, p. 23.

EDWARD C. ALLEN, *Primary Examiner.*

ALFRED S. TRASK, *Examiner.*